US010862508B1

(12) United States Patent
Zhao et al.

(10) Patent No.: US 10,862,508 B1
(45) Date of Patent: Dec. 8, 2020

(54) METHOD AND DEVICE FOR ENCODING AND COMPRESSING BIT STREAM

(71) Applicant: Shanghai Zhaoxin Semiconductor Co., Ltd., Shanghai (CN)

(72) Inventors: Wei Zhao, Beijing (CN); Zongpu Qi, Beijing (CN); Zheng Wang, Beijing (CN); Jiamin Situ, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/593,056

(22) Filed: Oct. 4, 2019

(30) Foreign Application Priority Data

Aug. 22, 2019 (CN) .......................... 2019 1 0777387

(51) Int. Cl.
*H03M 7/40* (2006.01)
*H03M 7/36* (2006.01)

(52) U.S. Cl.
CPC ....... *H03M 7/4093* (2013.01); *H03M 7/3044* (2013.01); *H03M 7/4012* (2013.01)

(58) Field of Classification Search
CPC . H03M 7/4093; H03M 7/3044; H03M 7/4012
USPC ..................................................... 341/55–70
See application file for complete search history.

(56) References Cited

U.S. PATENT DOCUMENTS

| 4,910,750 | A | * | 3/1990 | Fisher | H04L 25/4908 375/292 |
| 5,164,724 | A | * | 11/1992 | Hartley | G06F 7/5312 341/101 |
| 5,969,649 | A | * | 10/1999 | Ashley | H03M 5/145 341/59 |
| 5,991,346 | A | * | 11/1999 | Lu | H04L 7/0334 341/68 |
| 6,553,145 | B1 | * | 4/2003 | Kang | H04N 19/37 341/63 |
| 6,954,555 | B2 | * | 10/2005 | Shimada | H03M 7/42 341/67 |
| 8,184,712 | B2 | * | 5/2012 | Mukherjee | H03M 7/30 375/240.21 |
| 2002/0137290 | A1 | * | 9/2002 | Wils | H01L 29/42328 438/264 |
| 2003/0151529 | A1 | * | 8/2003 | Karczewicz | H04N 19/152 341/51 |
| 2006/0139186 | A1 | * | 6/2006 | Hoyer | H04L 25/4917 341/50 |
| 2008/0001798 | A1 | * | 1/2008 | Moll | G01R 31/31708 341/120 |
| 2010/0305449 | A1 | * | 12/2010 | Wegener | G01S 7/52034 600/459 |

(Continued)

Primary Examiner — Lam T Mai
(74) Attorney, Agent, or Firm — McClure, Qualey & Rodack, LLP (57) ABSTRACT

A method for encoding and compressing a bit stream is provided. The method includes: receiving a bit stream; determining whether a first number of bits that are consecutive and identical in the bit stream is greater than or equal to a first preset value; and when the first number is greater than or equal to the first preset value, the first number of bits are encoded as a first code in a first encoding way, wherein the first code is composed of a first prefix and a first suffix, and the first prefix represents what the consecutive bits are and the first suffix represents the first number.

20 Claims, 6 Drawing Sheets

(56) References Cited

U.S. PATENT DOCUMENTS

2016/0366431 A1* 12/2016 Kazui .................. H04N 21/4302
2017/0171560 A1*  6/2017 Kim ..................... H04N 19/176

* cited by examiner

METHOD AND DEVICE FOR ENCODING AND COMPRESSING BIT STREAM

CROSS REFERENCE TO RELATED APPLICATIONS

This application claims priority from Chinese Patent Application No. 201910777387.4, filed on Aug. 22, 2019 in the China Intellectual Property Office, the content of which is incorporated by reference herein.

BACKGROUND

Technical Field

The present disclosure generally relates to encoding and compression techniques.

More specifically, aspects of the present disclosure relate to a method and a device for encoding and compressing a bit stream.

Description of the Related Art

Automatic test equipment (ATE) is used to detect the integrity of integrated circuit (IC) functions to ensure quality in the IC manufacturing process.

With the increase of the scale of integrated circuit design, the amount of test data (including test input data and test output data) has increased exponentially. This has caused the storage space available in a traditional external ATE to become insufficient, the input and output bandwidth to become limited, and the time it takes to test data to become too long, among other serious problems. Test data compression is one of the most effective ways to solve the above problems. By compressing the test data, the data transfer time and requirements of the ATE storage capacity can be reduced. The encoding and compression method is one of the most commonly used methods for testing data compression.

In certain specific applications (for example, the integrated circuit to be tested is a chipset or a central processing unit (CPU)), the amount of test data is huge and need to be packaged (for example, be packaged in units of packets) to be stored in system memory, wherein the similarities of the test data after packaging are high. As a result, a method and a device for encoding and compressing a bit stream is provided in the present disclosure to compress the test data for improving the ratio of data compression.

SUMMARY

The following summary is illustrative only and is not intended to be limiting in any way. That is, the following summary is provided to introduce concepts, highlights, benefits and advantages of the novel and non-obvious techniques described herein. Select, not all, implementations are described further in the detailed description below. Thus, the following summary is not intended to identify essential features of the claimed subject matter, nor is it intended for use in determining the scope of the claimed subject matter.

In an exemplary embodiment, a method for encoding and compressing a bit stream is provided in the disclosure. The method comprises: receiving a bit stream; determining whether a first number of bits that are consecutive and identical in the bit stream is greater than or equal to a first preset value; and when the first number is greater than or equal to the first preset value, the first number of bits are encoded as a first code in a first encoding way, wherein the first code is composed of a first prefix and a first suffix, and the first prefix represents what the consecutive bits are and the first suffix represents the first number.

In an exemplary embodiment, a device for encoding and compressing a bit stream is provided in the disclosure. The device comprises one or more processors and one or more computer storage media for storing one or more computer-readable instructions. The processor is configured to drive the computer storage media to execute the following tasks: determining whether a first number of bits that are consecutive and identical in the bit stream is greater than or equal to a first preset value; and when the first number is greater than or equal to the first preset value, the first number of bits are encoded as a first code in a first encoding way, wherein the first code is composed of a first prefix and a first suffix, and the first prefix represents what the consecutive bits are and the first suffix represents the first number.

As described above, the present disclosure proposes to a method and a device for encoding and compressing a bit stream, utilizing the characteristic of repetitive and consecutive bits to achieve the goal of improving the ration of data compression.

BRIEF DESCRIPTION OF DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It should be appreciated that the drawings are not necessarily to scale as some components may be shown out of proportion to their size in actual implementation in order to clearly illustrate the concept of the present disclosure.

DETAILED DESCRIPTION

Various aspects of the disclosure are described more fully below with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using number of the aspects set forth herein. In addition, the scope of the disclosure is intended to cover such an apparatus or method which is practiced using another structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects. Furthermore, like numerals refer to like elements throughout the several views, and the articles "a" and "the" includes plural references, unless otherwise specified in the description.

It should be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion. (e.g., "between" versus "directly between", "adjacent" versus "directly adjacent", etc.).

Figure 1:
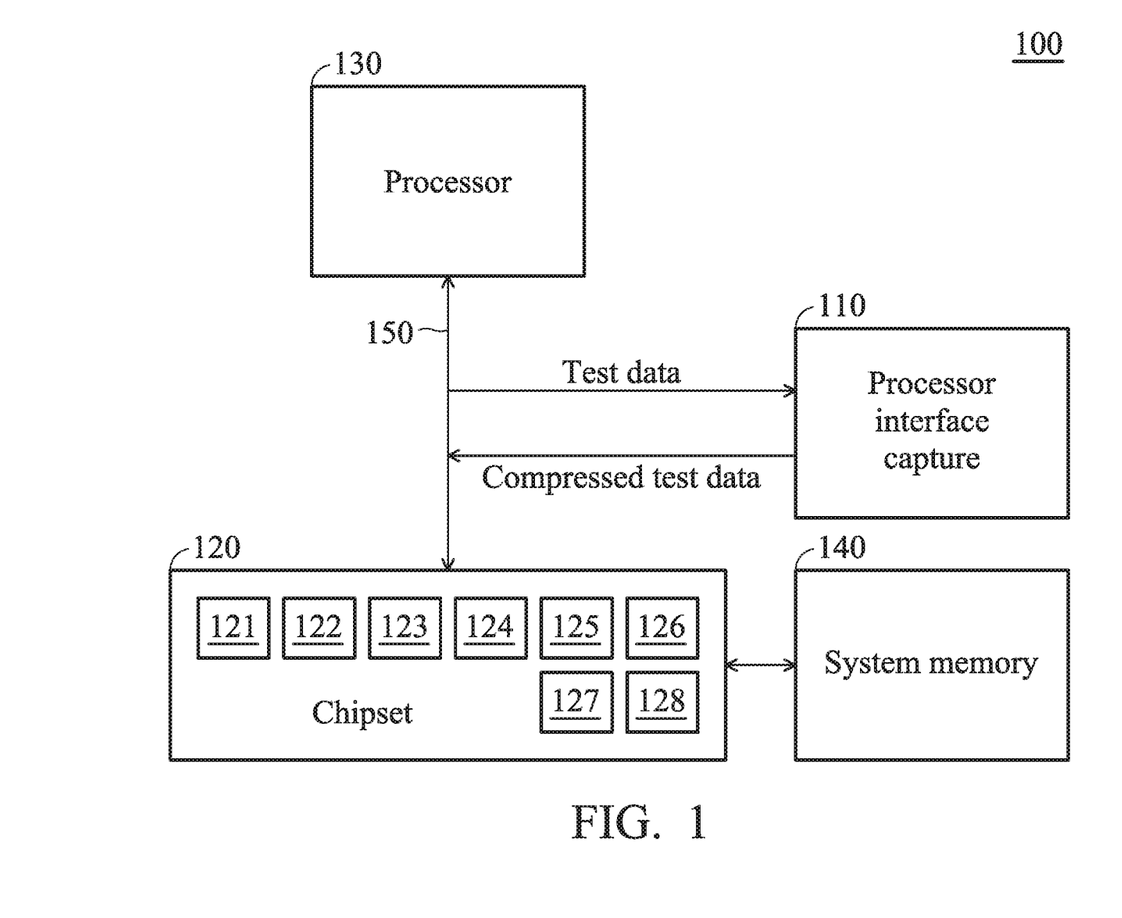
FIG. 1 is a block diagram illustrating selected aspects of a system having a processor interface capture (PIC) according to an embodiment of the disclosure.

FIG. 1 is a block diagram illustrating selected aspects of a system 100 having a processor interface capture (PIC) according to an embodiment of the disclosure. The system 100 may comprise at least a processor interface capture 110.

In an embodiment where the test object is a processor 130, the processor interface capture 110 is a module for testing and debugging the processor 130. The primary function of the module is to capture a test data (for example, an internal host interface (HIF) signal) output by the test object processor 130 on a processor interface 150, encapsulate the test data into a packet, and store the packet into a system memory 140 via a chipset 120. The processor interface capture 110 may support two configuration modes. One is model-specific register (MSR) and the other is a joint test action group (JTAG). It should be noted that the embodiment shown in FIG. 1 uses the processor 130 as a test object, and other integrated circuits may be used as test objects in other embodiments. It should not be limited to the processor interface capture 110 for capturing test data output only by the processor in the present disclosure, and the processor interface capture 110 may also be used to capture test data output by other integrated circuits (e.g., a chipset), wherein the test data may be used as a compression object.

The processor interface capture 110 can capture different types of test data in FIG. 1. In embodiments where the test object is the processor 130, the test data comprises, but is not limited to, test data from the following modules: a sideband signal cache 121, a PCIe_To_CPU_REQ (P2CREQ) cache 122, a CPU_To_PCIe_REQ (C2PREQ) cache 123, a Host_PCIe_Data (HPDATA) cache 124, a PCIe_Host_Data (PHDATA) cache 125, a CPU_Memory_Read_Data (CMRD) cache 126, a CPU_Memory_Write_Data (CMWD) cache 127, and a CPU_Memory_Request (CMREQ) cache 128. The bodies of the packets generated by encapsulating the test data have high similarity.

For example, Tables 1 to 4 are embodiments of the test data packets, C2PREQ, HPDATA, PHDATA, and Sideband after the processor interface capture 110 encapsulates the test data from the C2PREQ cache 123, the HPDATA cache 124, the PHDATA cache 125, and the sideband signal cache 121 according to an embodiment of the present disclosure.

TABLE 1

| |
| --- |
| 69 bit of C2PREQ: c00f2820ffd6800100 |
| 69 bit of C2PREQ: c0f02930ffd6800100 |
| 69 bit of C2PREQ: c00f2a30ffd6800100 |
| 69 bit of C2PREQ: c0f02b40ffd6800100 |
| 69 bit of C2PREQ: c00f2c40ffd6800100 |
| 69 bit of C2PREQ: c0f02d50ffd6800100 |
| 69 bit of C2PREQ: c00f2e50ffd6800100 |
| 69 bit of C2PREQ: c0f02f60ffd6800100 |
| 69 bit of C2PREQ: c00f3060ffd6800100 |
| 69 bit of C2PREQ: c0f03170ffd6800100 |

TABLE 2

| |
| --- |
| 146 bit of HPDATA: 000000000000000000000000000000004e2000 |
| 146 bit of HPDATA: 00000000000000000000000000000000502000 |
| 146 bit of HPDATA: 00000000000000000000000000000000522000 |
| 146 bit of HPDATA: 00000000000000000000000000000000542000 |
| 146 bit of HPDATA: 00000000000000000000000000000000562000 |
| 146 bit of HPDATA: 00000000000000000000000000000000582000 |
| 146 bit of HPDATA: 000000000000000000000000000000005a2000 |
| 146 bit of HPDATA: 000000000000000000000000000000005c2000 |
| 146 bit of HPDATA: 000000000000000000000000000000005e2000 |
| 146 bit of HPDATA: 00000000000000000000000000000000602000 |

TABLE 3

| |
| --- |
| 148 bit of PHDATA: 0000343434b4002000002834289ef9ffff3a40 |
| 148 bit of PHDATA: d6800020008000200002834289ef9ffff3a40 |
| 148 bit of PHDATA: 18000e0e0e0e0e0e0e8e417688c626f8a84640 |
| 148 bit of PHDATA: f20060002083802000080417688c626f8a84640 |
| 148 bit of PHDATA: 04800020008000200080417688c626f8a84640 |
| 148 bit of PHDATA: f6800020008000200080417688c626f8a84640 |
| 148 bit of PHDATA: 00004000208300200080ade4e1c07c00010040 |
| 148 bit of PHDATA: fa800020008000200080ade4e1c07c00010040 |
| 148 bit of PHDATA: 008000200080002000002834289ef9ffff3a40 |
| 148 bit of PHDATA: fe800020008000200002834289ef9ffff3a40 |

TABLE 4

| |
| --- |
| 100 bit of Sideband: 0400440000060410f5c31ff00f |
| 100 bit of Sideband: 2400440000060410f5c31ff00f |
| 100 bit of Sideband: 2400440000060410f5c31ff00e |
| 100 bit of Sideband: 2400440000060410f5c31ff00d |
| 100 bit of Sideband: 2400440000060410f5c31ff00f |
| 100 bit of Sideband: 2400440000060410f5c31ff00d |
| 100 bit of Sideband: 2400040000060410f5c31ff00d |
| 100 bit of Sideband: 2400440000060410f5c31ff00d |
| 100 bit of Sideband: 2400440000060410f5c31ff00f |
| 100 bit of Sideband: 2400440000060410f5c31ff00d |

The following describes how the present disclosure compresses the test packets, outputs and stores them to the system memory 140 via the chipset 120 to reduce the storage of the system memory 140 occupied by the test results.

Figure 2A:
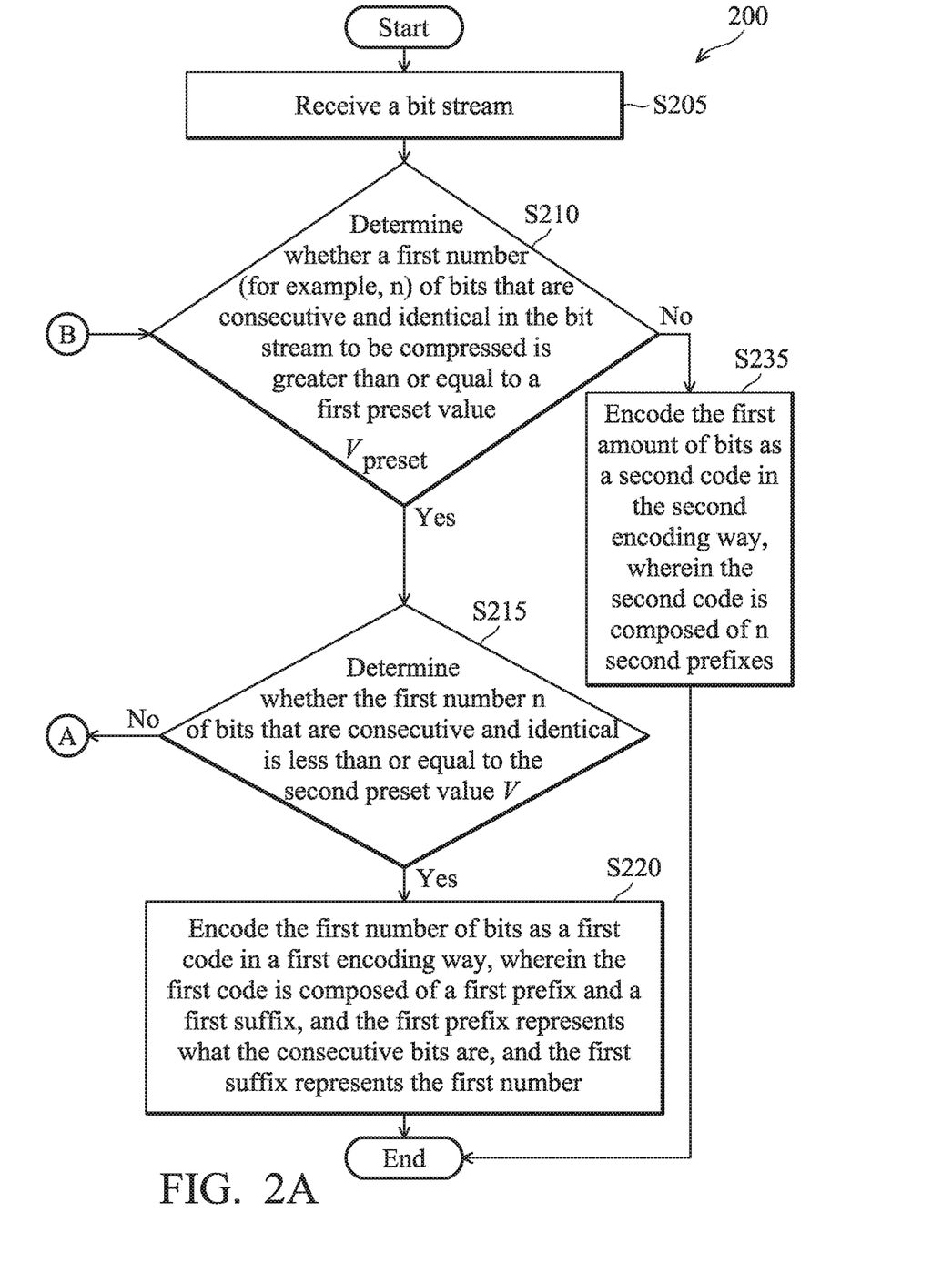
FIGS. 2A and 2B are flowcharts illustrating a method for encoding and compressing a bit stream according to an embodiment of the present disclosure.
Figure 2B:
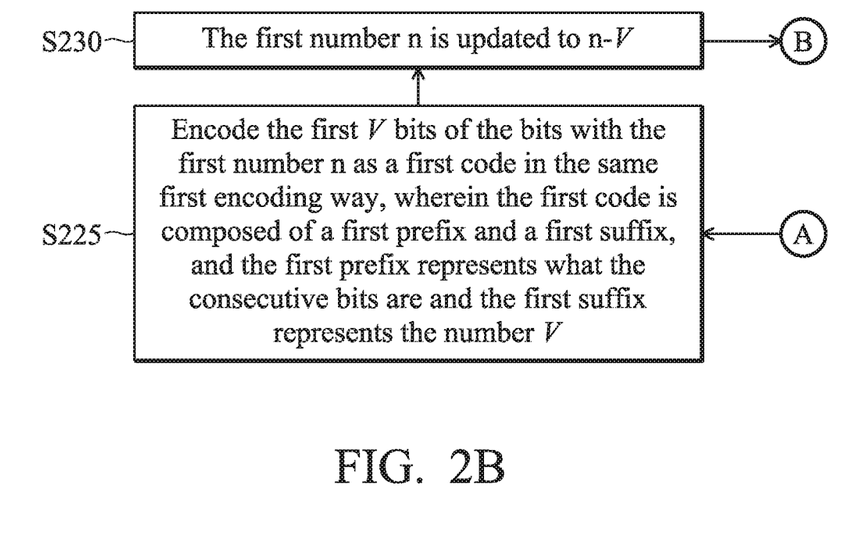

FIGS. 2A and 2B are flowcharts illustrating a method 200 for encoding and compressing a bit stream according to an embodiment of the present disclosure. The method 200 may be implemented in the electronic device 700 described with reference to FIG. 7, for example, and may also be implemented on the processor interface capture 110 as described in FIG. 1, wherein the type of electronic device ranges from a small handheld device (e.g., mobile phones and portable computers) to mainframe systems (such as large computers). Examples of portable computers include personal digital assistants (PDAs), notebooks, and the like.

In step S205, the electronic device receives a bit stream, which is composed of bits "1" and bits "0". In an embodiment, the bit stream is generated via an exclusive OR (XOR) process. For example, in the embodiment of FIG. 1, the electronic device (e.g., the processor interface capture 110) performs the exclusive OR process on the generated test data packets. Since the similarities between the test data packets of the same type (i.e., from the same module) are very high (as shown in Tables 1~4), the bits "0" are continuous in a large area in the bit stream generated by the exclusive OR process. It should be noted that it is not limited to compress the bit stream generated by the exclusive OR process in the present disclosure, and the method for encoding and compressing a bit stream in the present disclosure is applicable to the bit stream with a large number of consecutive bits "0" or bits "1" for compression processing to reduce the amount of data. That is, the processor interface capture 110 of FIG. 1 is merely an example of an electronic device that implements the method for encoding and compressing a bit stream of the present disclosure, but it should not be limited in the disclosure.

In step S210, the electronic device determines whether a first number (for example, n) of bits that are consecutive and identical in the bit stream to be compressed is greater than or equal to a first preset value $V_{preset}$. When it is determined that there are identical bits that are consecutive and greater than the first preset value $V_{preset}$ in the bit stream to be compressed ("Yes" in step S210), in step S215, it is determined whether the first number n of bits that are consecutive and identical in the bit stream to be compressed is less than or equal to the second preset value V.

When the first number n is less than or equal to the second preset value V ("Yes" in step S215), in step S220, the electronic device encodes the first number of bits as a first code in a first encoding way, wherein the first code is composed of a first prefix and a first suffix, and the first prefix represents what the consecutive bits are, and the first suffix represents the first number.

In one embodiment, the first preset value $V_{preset}$ is generated according to the following formula (1) or formula (2):

$$V_{preset} = \left[\frac{L}{2}\right] + 2 \text{ or} \quad (1)$$

$$V_{preset} = \frac{L}{2} + 2 \quad (2)$$

wherein $V_{preset}$ is the first preset value, L represents the bit length of the first suffix, [ ] is an operation for rounding down to the nearest integer. The first encoding way comprises: the first prefix is composed of two bits, and the first suffix is composed of bits of a bit length L. The first prefix "10" indicates that the consecutive bits are "0", and the first prefix "11" indicates that the consecutive bits are "1". It should be noted that it is not limited to the locations of the first prefix and the first suffix in the present disclosure. The first prefix may be located preceding the first suffix, or the first suffix may be located preceding the first prefix. Preferably, the first prefix is located preceding the first suffix.

The first suffix represents the first number. Specifically, there are many encoding ways (described in detail later in FIGS. 3 to 6). In an embodiment, the value of the first suffix (for example, m) is the value n of the first number, that is, m=n. In another embodiment, the value m of the first suffix is the value n of the first number minus 1, that is, the number of consecutive bits (i.e., the first number) is n and the value of the first suffix is m=n−1. Taking L=3 as an example, the first suffix m=2'b010 represents the lower boundary of the first number n is 3 (the lower boundary is equal to $$V_{preset} = \left[\frac{L}{2}\right] + 2 = 3,$$

i.e., the first encoding way is adopted when there are at least 3 consecutive bits of 0 or 1), the first suffix m=2'b011 represents the first number n=4, and the first suffix m=2'b100 represents the first number n=5, and so on. In another embodiment, the value m of the first suffix is generated according to the following formula (3):

$$m = n - \left(\left[\frac{L}{2}\right] + 2\right) \quad (3)$$

wherein m is the value of the first suffix, n is the first number, L represents the bit length of the first suffix (i.e., the number of bits of the first suffix), [ ] is an operation for rounding down to the nearest integer. The way in which the value n is represented in this embodiment can maximize the number of first number n that the first suffix m can represent. When the first number n is less than the first preset value $V_{preset}$, the first encoding way does not need to be used for encoding, and the encoding of the first suffix starts from the lower boundary of the first number n (i.e., n is equal to the preset value $V_{preset}$). Taking L=3 as an example, the smallest first suffix m=2'b000 (the smallest code when L=3) represents the lower boundary of the first number n is 3 (the lower boundary is equal to $$V_{preset} = \left[\frac{L}{2}\right] + 2 = 3,$$

i.e., the first encoding way is adopted when there are at least 3 consecutive bits of 0 or 1), the first suffix m=2'b001 represents the first number n=4, and the first suffix m=2'b010 represents the first number n=5, and so on. Therefore, the first suffix m of L=3 can represent that the maximum value of the first number n is 10 (represented by the first suffix 2'b111). Of course, it is not limited to the encoding way of the first suffix to the several embodiments mentioned above in the present disclosure. Those skilled in the art may use other encoding ways to encode the first suffix m to represent the number of consecutive and identical bits n, which also belong to the scope of protection in the present disclosure.

Back to step S215, when the electronic device determines that the first number n is greater than the second preset value V ("No" in step S215), step S225 is performed and the electronic device encodes the first V bits of the bits with the first number n as a first code in the same first encoding way, wherein the first code is composed of a first prefix and a first suffix, and the first prefix represents what the consecutive bits are and the first suffix represents the number V. Then, step S230 is performed. In step S230, the first number n is updated to n−V, that is, the number of consecutive and identical bits is counted again from the next bit of the second preset value V, and then step S210 is performed. As mentioned before, the bit length L included in the first suffix m is preset, so the maximum first number n that the first suffix can represent is also determined. In the embodiment in which the first suffix is encoded by the formula (3), when L=3, m=n-3 and the maximum value of the first number n which can be represented by the first suffix m is 10 (the first suffix m=2'b111). In the embodiment in which m=n-1 as described above, the maximum value of the first number n which can be represented by the first suffix m of L=3 is 8 (the first suffix m=2'b111). The upper boundary of the maximum value that can be represented here is the second preset value V. When the first number n is greater than the second preset value V that can be represented by the first suffix m, the first V bits are encoded first in step S225 and then S230 is executed to count the number of bits n that is consecutive and identical from the next bit.

Back to step S210, when the electronic device determines that the first number n of bits that are consecutive and identical is not greater than or equal to the first preset value ("No" in step S210), in step S235, the electronic device encodes n bits (i.e., the first number of bits) as a second code in the second encoding way, wherein the second code is composed of n second prefixes. In one embodiment, each of the second prefixes is composed of two bits, wherein the second prefix "00" indicates that the bit is "0", and the second prefix "01" indicates that the bit is "1". Each of n bits (when n is smaller than the first preset value $V_{preset}$) is separately encoded as the second code, and the bit "0" is represented by the second prefix "00", and the bit "1" is represented by the second prefix "01".

As an example, Table 5 shows the encoding way of an embodiment of the present disclosure. It is assumed that the number of bits L of the first suffix is 3, and the first preset value $$V_{preset} = \left[\frac{L}{2}\right] + 2 = 3.$$

That is, three or more consecutive bits of "0" or "1" can be considered to be continuous, and two or less bits of "0" or "1" are considered to be discontinuous.

TABLE 5

|  | Bit | Prefix of Code |
|---|---|---|
| 1$^{st}$ encoding way | Continuous bit "0" | 10 |
|  | Continuous bit "1" | 11 |
| 2$^{nd}$ encoding way | Discontinuous bit "0" | 00 |
|  | Discontinuous bit "1" | 01 |

It is assumed that the electronic device receives hexadecimal data 0xFF0001FC. The bit stream converted to binary by 0xFF0001FC is 2'b1111 1111 0000 0000 0000 0001 1111 1100. In this embodiment, the number of bits L of the first suffix is 3, and the first preset value $$V_{preset} = \left[\frac{L}{2}\right] + 2 = 3.$$

The electronic device may determine whether the first number of bits n that are consecutive and identical from the starting bit in the bit stream is greater than or equal to the first preset value $V_{preset}$=3 and less than or equal to the second preset value V=8. In the binary bit stream, 2'b1111 1111 has consecutive and identical bits "1". The number of identical bits "1" is 8, which is greater than or equal to the first preset value $V_{preset}$=3 and less than or equal to the second preset value V=8, so 2'b1111 1111 is encoded in the first encoding way. In the first embodiment, the encoding way of the suffix is shown in Table 6. The first encoding way described in Table 6 adopts the encoding way of the value m=n-1 of the suffix, so the second preset value V (i.e., the longest first number n that can be encoded) is 8.

TABLE 6

| Bit length n | Suffix m |
|---|---|
| 1 | 000 |
| 2 | 001 |
| 3 | 010 |
| 4 | 011 |
| 5 | 100 |
| 6 | 101 |
| 7 | 110 |
| 8 | 111 |

Figure 3:
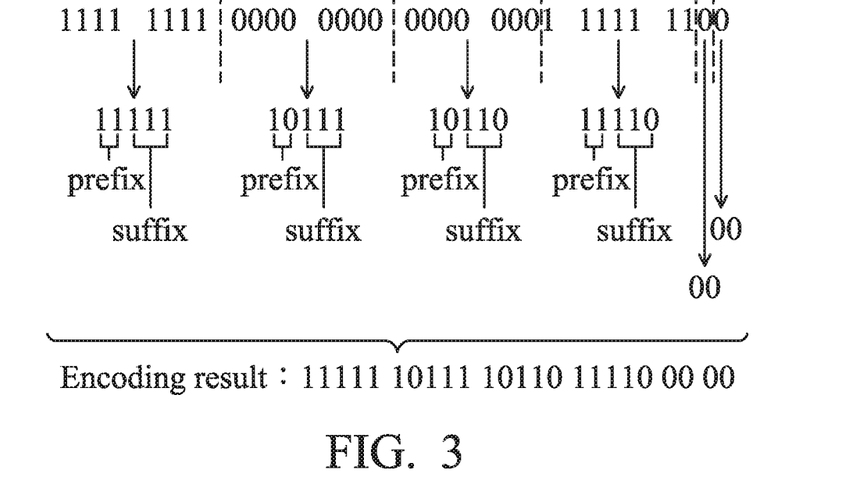
FIG. 3 is a schematic diagram illustrating a method for encoding and compressing a bit stream in accordance with an embodiment of the present disclosure.

The bit length of 2'b1111 1111 is 8, the electronics device may encode 2'b1111 1111 as 2'b11111 according to Table 5 and Table 6, wherein the prefix is 11 that represents the consecutive bits are "1", and the suffix is 111 that represents the first number n of the consecutive bits. In this way, the bit stream 2'b1111 1111 0000 0000 0000 0001 1111 1100 can be encoded as 2'b11111 10111 10110 11110 00 00. FIG. 3 is a schematic diagram illustrating a method for encoding and compressing a bit stream in accordance with an embodiment of the present disclosure. The compression result is converted to hexadecimal is 0xFDEDE0, wherein the compression result is 2 bytes less than the original hexadecimal data.

In the embodiment where the first preset value $V_{preset}$≥2, since when the bit length is 1, the second encoding way is utilized, thus the first encoding way is not used, and there is no need to encode the bit whose bit length (i.e., the first number n) is 1 in the first encoding way. In a second embodiment, the encoding way of the suffix is shown in Table 7. The first encoding way of Table 7 starts encoding from the bit whose bit length is 2 (it should be noted that, in the embodiment where the first preset value $V_{preset}$≥3, the bit length 2 is also invalid in the first encoding way), and the encoding way adopts the value of the suffix m=n-2, and therefore the second preset value V (i.e., the longest first number n that can be encoded) is 9.

TABLE 7

| Bit length n | Suffix m |
|---|---|
| 2 | 000 |
| 3 | 001 |
| 4 | 010 |
| 5 | 011 |
| 6 | 100 |
| 7 | 101 |
| 8 | 110 |
| 9 | 111 |

The electronic device can encode the bit stream 2'b1111 1111 0000 0000 0000 0001 1111 1100 as 2'b11110 10111 10100 11101 00 00 according to Table 5 and Table 7. Please refer to FIG. 4 for detailed bit stream encoding.

In the embodiment where the first preset value $V_{preset}$≥3, since when the bit lengths are 1 and 2, the second encoding way is utilized, thus the first encoding way is not used. It is started encoding from the bit whose bit length is 3 in the first encoding way. In a third embodiment, the encoding way of the suffix is shown in Table 8. The first encoding way of Table 8 adopts the suffix value m=n-3, and therefore the second preset value V (i.e., the longest first number n that can be encoded) is 10.

TABLE 8

| Bit length n | Suffix m |
|---|---|
| 3 | 000 |
| 4 | 001 |
| 5 | 010 |
| 6 | 011 |
| 7 | 100 |
| 8 | 101 |
| 9 | 110 |
| 10 | 111 |

Figure 4:
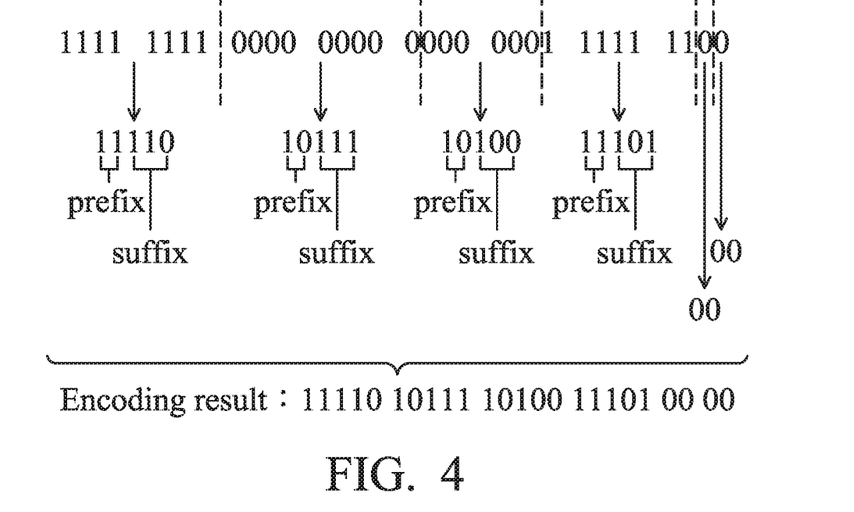
FIG. 4 is a schematic diagram illustrating a method for encoding and compressing a bit stream in accordance with an embodiment of the present disclosure.
Figure 5:
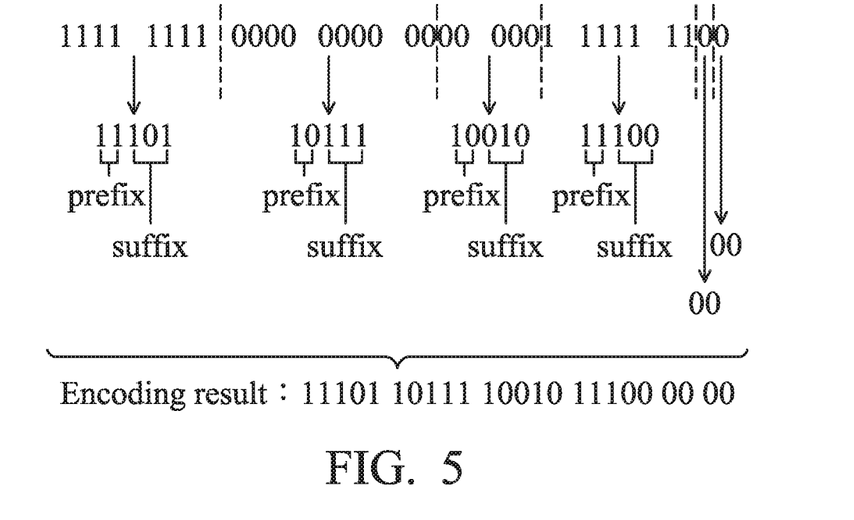
FIG. 5 is a schematic diagram illustrating a method for encoding and compressing a bit stream in accordance with an embodiment of the present disclosure.
Figure 6:
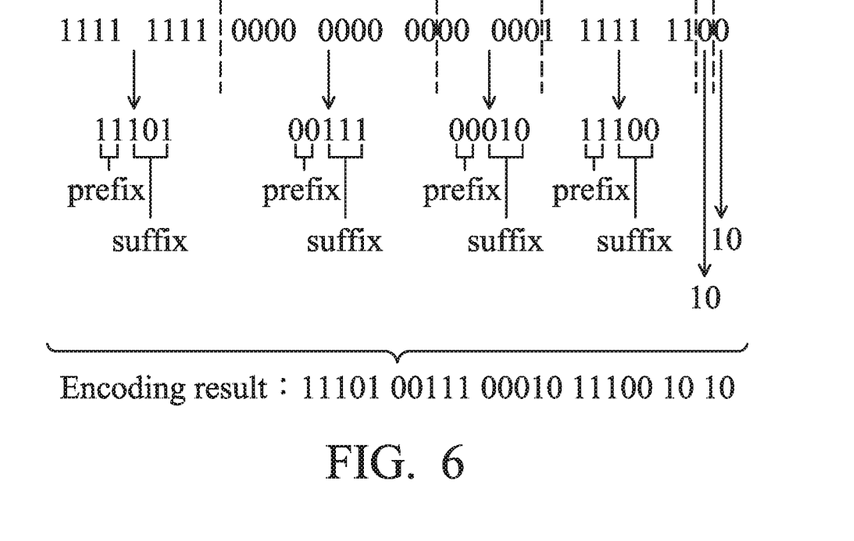
FIG. 6 is a schematic diagram illustrating a method for encoding and compressing a bit stream in accordance with an embodiment of the present disclosure.

The electronic device encodes the bit stream 2'b1111 1111 0000 0000 0000 0001 1111 1100 as 2'b11101 10111 10010 11100 00 00 according to Table 5 and Table 8. Please refer to FIG. 5 for detail of bit stream encoding. Note that the second preset values of FIGS. 3, 4, and 5 are 8, 9, and 10, respectively. Therefore, when the consecutive bits [0] of the second part are encoded, the objects to be encoded at once are 8, 9, and 10 bits, respectively.

In another embodiment, the first encoding way and the second encoding way may also be represented by other encoding bits that are different from the encoding bits in Table 5, as shown in Table 9.

TABLE 9

| | Bit | Prefix of Code |
|---|---|---|
| 1$^{st}$ encoding way | Continuous bit "0" | 00 |
| | Continuous bit "1" | 11 |
| 2$^{nd}$ encoding way | Discontinuous bit "0" | 10 |
| | Discontinuous bit "1" | 01 |

The electronic device encodes the bit stream 2'b1111 1111 0000 0000 0000 0001 1111 1100 as 2'b11101 00111 00010 11100 10 10 according to Table 9 and Table 8. Please refer to FIG. 6 for details of bit stream encoding In an embodiment, the bit stream is generated according to a plurality of test data generated for testing an integrated circuit (for example, the processor 130 of the embodiment of FIG. 1), and the test data have high similarity. In another embodiment, the bit stream may also be data such as voice data, video bit streams, or pixel bit streams constituting a gray-scale image. It is not limited to what type of bit stream to which the compression method disclosed in the present disclosure is applied.

Back to FIG. 1, Tables 10~13 show the optimal bit lengths and compression rates, which are obtained by performing the exclusive OR process on the test data packets shown in Tables 1~4 by using the method for encoding and compressing a bit stream in the present disclosure:

TABLE 10

| C2PREQ | Optimal bit length | Body of the original bit stream | Body of the compressed bit stream | Compression rate of the body of the bit stream |
|---|---|---|---|---|
| Result | 6 | 42260611 | 18320894 | 43% |

TABLE 11

| HPDATA | Optimal bit length | Body of the original bit stream | Body of the compressed bit stream | Compression rate of the body of the bit stream |
|---|---|---|---|---|
| Result | 7 | 89281317 | 17858900 | 20% |

TABLE 12

| PHDATA | Optimal bit length | Body of the original bit stream | Body of the compressed bit stream | Compression rate of the body of the bit stream |
|---|---|---|---|---|
| Result | 7 | 146686 | 98750 | 67% |

TABLE 13

| Sideband | Optimal bit length | Body of the original bit stream | Body of the compressed bit stream | Compression rate of the body of the bit stream |
|---|---|---|---|---|
| Result | 7 | 219973400 | 41776756 | 18% |

As shown in Tables 10~13, the method for encoding and compressing a bit stream of the present disclosure can reduce the expansion rate of the original encoding way and achieve a better compression rate.

In another embodiment, the test data packet generated by the processor interface capture 110 of FIG. 1 may further comprise a header in addition to the body. The data length of the header is often short (for example, 4 bytes), and the method for encoding and compressing a bit stream proposed in FIGS. 2~6 are used to encode and compress the header in the present disclosure. Table 14 shows the result of encoding and compressing the body and header of the bit stream.

TABLE 14

| | Header of the original bit stream | Header of the compressed bit stream | Compression rate of the header of the bit stream | Body of the original bit stream | Body of the compressed bit steam | Compression rate of the header of the bit stream | Overall compression rate |
|---|---|---|---|---|---|---|---|
| size | 170998260 | 144914721 | 84% | 351662015 | 80221161 | 22% | 48% |

In this test, when the bit length L of the suffix of the first code of the body is 7 bits and the bit length L of the suffix of first code of the header is 4 bits, the overall compression result is optimal.

As described above, a method and a device for encoding and compressing a bit stream in present disclosure utilizes the characteristics of repeated and continuous bits to achieve the purpose of increasing the data compression rate.

Figure 7:
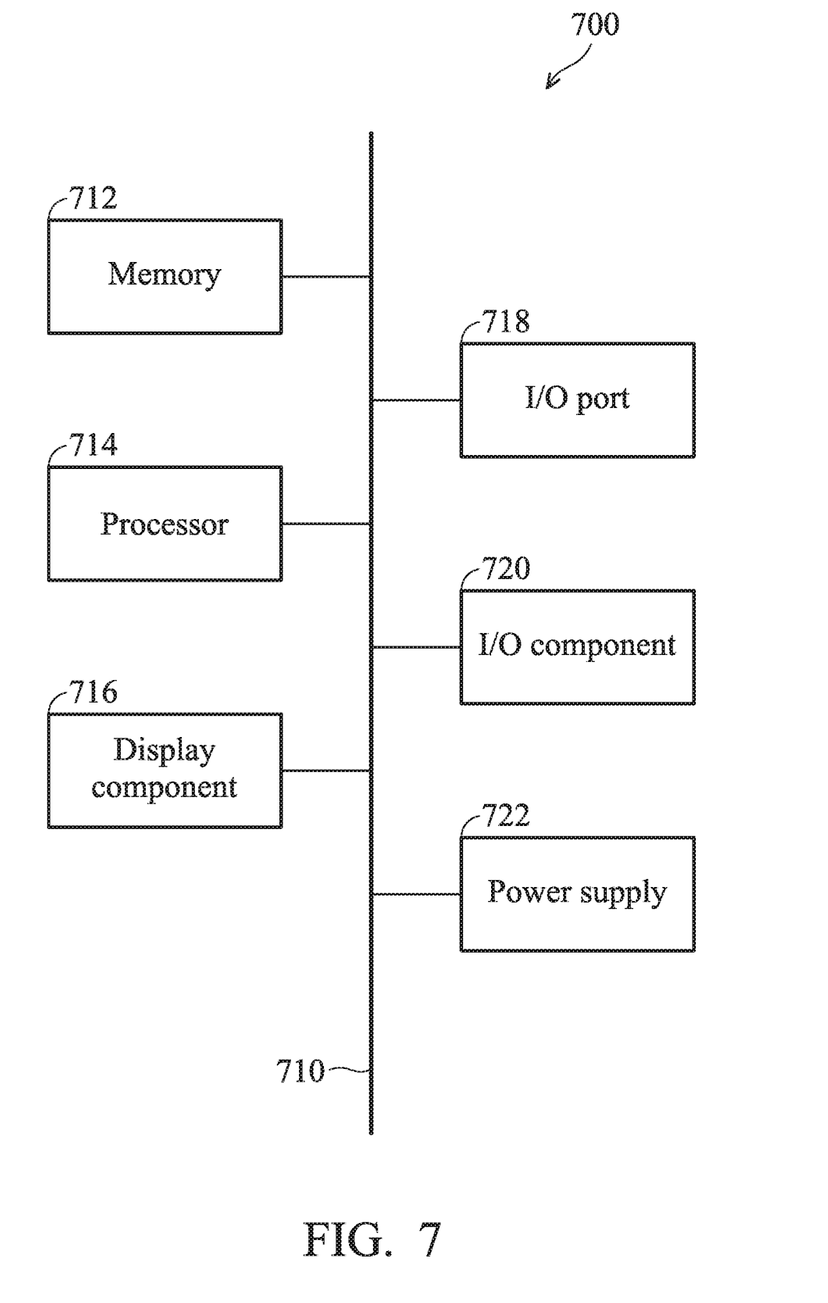
FIG. 7 illustrates an exemplary operating environment for implementing embodiments of the present disclosure.

Having described embodiments of the present disclosure, an exemplary operating environment in which embodiments of the present disclosure may be implemented is described below. Referring to FIG. 7, an exemplary operating environment for implementing embodiments of the present disclosure is shown and generally known as an electronic device 700. The electronic device 700 is merely an example of a suitable computing environment and is not intended to limit the scope of use or functionality of the disclosure. Neither should the electronic device 700 be interpreted as having any dependency or requirement relating to any one or combination of components illustrated.

The disclosure may be realized by means of the computer code or machine-useable instructions, including computer-executable instructions such as program modules, being executed by a computer or other machine, such as a personal data assistant (PDA) or other handheld device. Generally, program modules may include routines, programs, objects, components, data structures, etc., and refer to code that performs particular tasks or implements particular abstract data types. The disclosure may be implemented in a variety of system configurations, including hand-held devices, consumer electronics, general-purpose computers, more specialty computing devices, etc. The disclosure may also be implemented in distributed computing environments where tasks are performed by remote-processing devices that are linked by a communication network.

With reference to FIG. 7, the electronic device 700 may include a bus 710 that is directly or indirectly coupled to the following devices: one or more memories 712, one or more processors 714, one or more display components 716, one or more input/output (I/O) ports 718, one or more input/output components 720, and an illustrative power supply 722. The bus 710 may represent one or more kinds of busses (such as an address bus, data bus, or any combination thereof). Although the various blocks of FIG. 7 are shown with lines for the sake of clarity, and in reality, the boundaries of the various components are not specific. For example, the display component such as a display device may be considered an I/O component and the processor may include a memory.

The electronic device 700 typically includes a variety of computer-readable media. The computer-readable media can be any available media that can be accessed by an electronic device 700 and includes both volatile and non-volatile media, removable and non-removable media. By way of example, not limitation, computer-readable media may comprise computer storage media and communication media. The computer storage media may include volatile and nonvolatile, removable and non-removable media implemented in any method or technology for storage of information such as computer-readable instructions, data structures, program modules or other data. The computer storage media may include, but not limit to, random access memory (RAM), read-only memory (ROM), electrically-erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by the electronic device 700. The computer storage media may not comprise signals per se.

The communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, but not limitation, communication media includes wired media such as a wired network or direct-wired connection, and wireless media such as acoustic, RF, infrared and other wireless media or any combination thereof.

The memory 712 may include computer-storage media in the form of volatile and/or nonvolatile memory. The memory may be removable, non-removable, or a combination thereof. Exemplary hardware devices include solid-state memory, hard drives, optical-disc drives, etc. The electronic device 700 includes one or more processors that read data from various entities such as the memory 712 or the I/O components 720. The display component(s) 716 present data indications to a user or other device. Exemplary presentation components include a display device, speaker, printing component, vibrating component, etc.

The I/O ports 718 allow the electronic device 700 to be logically coupled to other devices including the I/O components 720, some of which may be embedded. Illustrative components include a microphone, joystick, game pad, satellite dish, scanner, printer, wireless device, etc. The I/O components 720 may provide a natural user interface (NUI) that processes gestures, voice, or other physiological inputs generated by a user. For example, inputs may be transmitted to an appropriate network element for further processing. A NUI may be implemented to realize speech recognition, touch and stylus recognition, facial recognition, biometric recognition, gesture recognition both on screen and adjacent to the screen, air gestures, head and eye tracking, touch recognition associated with displays on the electronic device 700, or any combination thereof. The electronic device 700 may be equipped with depth cameras, such as stereoscopic camera systems, infrared camera systems, RGB camera systems, or any combination thereof, to realize gesture detection and recognition. Furthermore, the electronic device 700 may be equipped with accelerometers or gyroscopes that enable detection of motion. The output of the accelerometers or gyroscopes may be provided to the display of the electronic device 700 to carry out immersive augmented reality or virtual reality.

Furthermore, the processor 714 in the electronic device 700 can execute the program code in the memory 712 to perform the above-described actions and steps or other descriptions herein.

It should be understood that any specific order or hierarchy of steps in any disclosed process is an example of a sample approach. Based upon design preferences, it should be understood that the specific order or hierarchy of steps in the processes may be rearranged while remaining within the scope of the present disclosure. The accompanying method claims present elements of the various steps in a sample order, and are not meant to be limited to the specific order or hierarchy presented.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for encoding and compressing a bit stream, comprising:
   receiving a bit stream;
   determining whether a first number of bits that are consecutive and identical in the bit stream is greater than or equal to a first preset value; and
   when the first number is greater than or equal to the first preset value, the first number of bits are encoded as a first code in a first encoding way, wherein the first code is composed of a first prefix and a first suffix, and the first prefix represents what the consecutive bits are and the first suffix represents the first number.

2. The method for encoding and compressing a bit stream as claimed in claim 1, wherein the first preset value is generated according to the following formula:

$$V_{preset} = \left[\frac{L}{2}\right] + 2 \text{ or}$$

$$V_{preset} = \frac{L}{2} + 2,$$

wherein $V_{preset}$ is the first preset value, L represents a bit length of the first suffix, and [ ] is an operation for rounding down to the nearest integer.

3. The method for encoding and compressing a bit stream as claimed in claim 1, wherein the first encoding way comprises:
   the first prefix is composed of two bits, and the first suffix is composed of bits of a bit length L.

4. The method for encoding and compressing a bit stream as claimed in claim 1, wherein a value of the first suffix is generated according to the following formula:

$$m = n - \left(\left[\frac{L}{2}\right] + 2\right),$$

wherein m is the value of the first suffix, n is the first number, L represents a bit length of the first suffix, and [ ] is an operation for rounding down to the nearest integer.

5. The method for encoding and compressing a bit stream as claimed in claim 1, wherein the first prefix "10" indicates that the consecutive bits are "0", and the first prefix "11" indicates that the consecutive bits are "1".

6. The method for encoding and compressing a bit stream as claimed in claim 1, wherein the method further comprises:
   determining whether the first number is less than or equal to a second preset value;
   encoding the first number of bits as the first code in the first encoding way when the first number is less than or equal to the second preset value and greater than or equal to the first preset value; and
   when the first number is greater than the second preset value, encoding a number of preceding bits of the first number of bits as the first code in the first encoding way and subtracting the second preset value from the first number, wherein the number of preceding bits is the second preset value.

7. The method for encoding and compressing a bit stream as claimed in claim 1, wherein when determining that the first number of bits that are consecutive and identical in the bit stream is not greater than or equal to a first preset value, the first number of bits is encoded as a second code in a second encoding way, wherein the second code consists of the first number of second prefixes.

8. The method for encoding and compressing a bit stream as claimed in claim 7, wherein each of the second prefixes is composed of two bits, the second prefix "00" indicates that the bits are "0", and the second prefix "01" indicates that the bits are "1".

9. The method for encoding and compressing a bit stream as claimed in claim 1, wherein the bit stream is generated via an exclusive OR (XOR) process.

10. The method for encoding and compressing a bit stream as claimed in claim 1, wherein the bit stream is generated according to a plurality of test data generated by testing an integrated circuit, wherein the plurality of test data have high similarity.

11. A device for encoding and compressing a bit stream, comprising:
    one or more processors; and
    one or more computer storage media for storing one or more computer-readable instructions, wherein the processor is configured to drive the computer storage media to execute the following tasks:
    determining whether a first number of bits that are consecutive and identical in the bit stream is greater than or equal to a first preset value; and
    when the first number is greater than or equal to the first preset value, the first number of bits are encoded as a first code in a first encoding way, wherein the first code is composed of a first prefix and a first suffix, and the first prefix represents what the consecutive bits are and the first suffix represents the first number.

12. The device for encoding and compressing a bit stream as claimed in claim 11, wherein the first preset value is generated according to the following formula:

$$V_{preset} = \left[\frac{L}{2}\right] + 2 \text{ or}$$

$$V_{preset} = \frac{L}{2} + 2,$$

wherein $V_{preset}$ is the first preset value, L represents a bit length of the first suffix, and [ ] is an operation for rounding down to the nearest integer.

13. The device for encoding and compressing a bit stream as claimed in claim 11, wherein the first encoding way comprises:
    the first prefix is composed of two bits, and the first suffix is composed of bits of a bit length L.

14. The device for encoding and compressing a bit stream as claimed in claim 11, wherein a value of the first suffix is generated according to the following formula:

$$m = n - \left(\left\lfloor \frac{L}{2} \right\rfloor + 2\right),$$

wherein m is the value of the first suffix, n is the first number, L represents a bit length of the first suffix, and [ ] is an operation for rounding down to the nearest integer.

15. The device for encoding and compressing a bit stream as claimed in claim 11, wherein the first prefix "10" indicates that the consecutive bits are "0", and the first prefix "11" indicates that the consecutive bits are "1".

16. The device for encoding and compressing a bit stream as claimed in claim 11, wherein the processor further executes the following tasks:
   determining whether the first number is less than or equal to a second preset value;
   encoding the first number of bits as the first code in the first encoding way when the first number is less than or equal to the second preset value and greater than or equal to the first preset value; and
   when the first number is greater than the second preset value, encoding a number of preceding bits of the first number of bits as the first code in the first encoding way and subtracting the second preset value from the first number, wherein the number of preceding bits is the second preset value.

17. The device for encoding and compressing a bit stream as claimed in claim 11, wherein when determining that the first number of bits that are consecutive and identical in the bit stream is not greater than or equal to a first preset value, the first number of bits is encoded as a second code in a second encoding way, wherein the second code consists of the first number of second prefixes.

18. The device for encoding and compressing a bit stream as claimed in claim 17, wherein each of the second prefixes is composed of two bits, the second prefix "00" indicates that the bits are "0", and the second prefix "01" indicates that the bits are "1".

19. The device for encoding and compressing a bit stream as claimed in claim 11, wherein the bit stream is generated via an exclusive OR (XOR) process.

20. The device for encoding and compressing a bit stream as claimed in claim 11, wherein the bit stream is generated according to a plurality of test data generated by testing an integrated circuit, wherein the plurality of test data have high similarity.

* * * * *